United States Patent
Jansen et al.

(10) Patent No.: US 8,064,151 B2
(45) Date of Patent: Nov. 22, 2011

(54) LITHOGRAPHIC APPARATUS AND THERMAL OPTICAL MANIPULATOR CONTROL METHOD

(75) Inventors: Bastiaan Stephanus Hendricus Jansen, Waalre (NL); Ulrich Schönhoff, Ulm (DE); Markus Hauf, Ulm (DE)

(73) Assignee: ASML Netherlands B.V., Veldhoven (NL)

( * ) Notice: Subject to any disclaimer, the term of this patent is extended or adjusted under 35 U.S.C. 154(b) by 488 days.

(21) Appl. No.: 11/889,583

(22) Filed: Aug. 14, 2007

(65) Prior Publication Data

US 2009/0046260 A1   Feb. 19, 2009

(51) Int. Cl.
G02B 7/02 (2006.01)
H05B 1/02 (2006.01)

(52) U.S. Cl. ......... 359/820; 359/811; 359/900; 219/490

(58) Field of Classification Search ............. 359/820, 359/845–846, 811, 900; 219/490–497; 355/30
See application file for complete search history.

(56) References Cited

U.S. PATENT DOCUMENTS

| | | | |
|---|---|---|---|
| 5,390,228 A | 2/1995 | Niibe et al. | |
| 5,805,273 A | 9/1998 | Unno | |
| 6,846,086 B2* | 1/2005 | Goldstein | 359/846 |
| 6,994,444 B2* | 2/2006 | del Puerto | 359/883 |
| 7,081,949 B2 | 7/2006 | Hara | |
| 7,098,994 B2 | 8/2006 | Moors et al. | |
| 7,375,794 B2 | 5/2008 | Box | |
| 7,408,728 B2* | 8/2008 | Bloch et al. | 359/820 |
| 2003/0169520 A1 | 9/2003 | Goldstein | |
| 2004/0051984 A1 | 3/2004 | Oshino et al. | |
| 2008/0123066 A1 | 5/2008 | Hendricus Jansen et al. | |

FOREIGN PATENT DOCUMENTS

| | | |
|---|---|---|
| JP | 05-066297 A | 3/1993 |
| JP | 05-190409 A | 7/1993 |
| JP | 08-008178 A | 1/1996 |
| JP | 10-284390 A | 10/1998 |
| JP | 11-008180 A | 1/1999 |
| JP | 2000-036449 A | 2/2000 |
| JP | 2000-187514 A | 7/2000 |
| JP | 2001-013297 A | 1/2001 |
| JP | 2002-108408 A | 4/2002 |
| JP | 2002-359178 A | 12/2002 |
| JP | 2004-031952 A | 1/2004 |

(Continued)

OTHER PUBLICATIONS

English language Abstract of Japanese Paten Publication No. 05-066297 A, the Japanese Patent Office, published Mar. 19, 1993; 1 page.

(Continued)

*Primary Examiner* — Ricky Mack
*Assistant Examiner* — Zachary Wilkes
(74) *Attorney, Agent, or Firm* — Sterne, Kessler, Goldstein & Fox P.L.L.C.

(57) ABSTRACT

A control method is provided for controlling a heating of a thermal optical element, the thermal optical element having a matrix of heater elements. The method includes stabilizing a nominal temperature of the thermal optical element with a feedback loop to control the heating of heater elements; providing a desired temperature profile of the thermal optical element by a set point signal; determining a feedforward control of the heater elements from the set point signal; and forwardly feeding an output of the feedforward control into the feedback loop.

18 Claims, 4 Drawing Sheets

FOREIGN PATENT DOCUMENTS

| | | |
|---|---|---|
| JP | 2004-039851 A | 2/2004 |
| JP | 2004-063670 A | 2/2004 |
| JP | 2004-228456 A | 8/2004 |
| JP | 2005-217398 A | 8/2005 |
| JP | 2006-049909 A | 2/2006 |
| JP | 2007-193527 A | 8/2007 |

OTHER PUBLICATIONS

English language Abstract of Japanese Patent Publication No. 05-190409 A, the Japanese Patent Office, published Jul. 30, 1993; 1 page.

English language Abstract of Japanese Patent Publication No. 08-008178 A, the Japanese Patent Office, published Jan. 12, 1996; 1 page.

English language Abstract of Japanese Patent Publication No. 10-284390 A, the Japanese Patent Office, published Oct. 23, 1998; 1 page.

English language Abstract of Japanese Patent Publication No. 11-008180 A, the Japanese Patent Office, published Jan. 12, 1999; 1 page.

English language Abstract of Japanese Patent Publication No. 2000-036449 A, the Japanese Patent Office, published Feb. 12, 2000; 1 page.

English language Abstract of Japanese Patent Publication No. 2000-187514 A, the Japanese Patent Office, published Jul. 4, 2000; 1 page.

English language Abstract of Japanese Patent Publication No. 2001-013297 A, the Japanese Patent Office, published Jan. 19, 2001; 1 page.

English language Abstract of Japanese Patent Publication No. 2002-108408 A, the Japanese Patent Office, published Apr. 10, 2002; 1 page.

English language Abstract of Japanese Patent Publication No. 2002-359178 A, the Japanese Patent Office, published Dec. 13, 2002; 1 page.

English language Abstract of Japanese Patent Publication No. 2004-031952 A, the Japanese Patent Office, published Jan. 29, 2004; 1 page.

English language Abstract of Japanese Patent Publication No. 2004-039851 A, the Japanese Patent Office, published Feb. 5, 2004; 1 page.

English language Abstract of Japanese Patent Publication No. 2004-063670 A, the Japanese Patent Office, published Feb. 26, 2004; 1 page.

English language Abstract of Japanese Patent Publication No. 2004-228456 A, the Japanese Patent Office, published Aug. 12, 2004; 1 page.

English language Abstract of Japanese Patent Publication No. 2005-217398 A, the Japanese Patent Office, published Aug. 11, 2005; 1 page.

English language Abstract of Japanese Patent Publication No. 2006-049909 A, the Japanese Patent Office, published Feb. 16, 2006; 1 page.

English language Abstract of Japanese Patent Publication No. 2007-193527 A, the Japanese Patent Office, published Aug. 22, 2007; 1 page.

English translation of Japanese Notice of Reasons for Rejection directed to related Japanese Patent Application No. 2008-203661, from the Japanese Patent Office, mailed Mar. 1, 2011; 4 pages.

\* cited by examiner

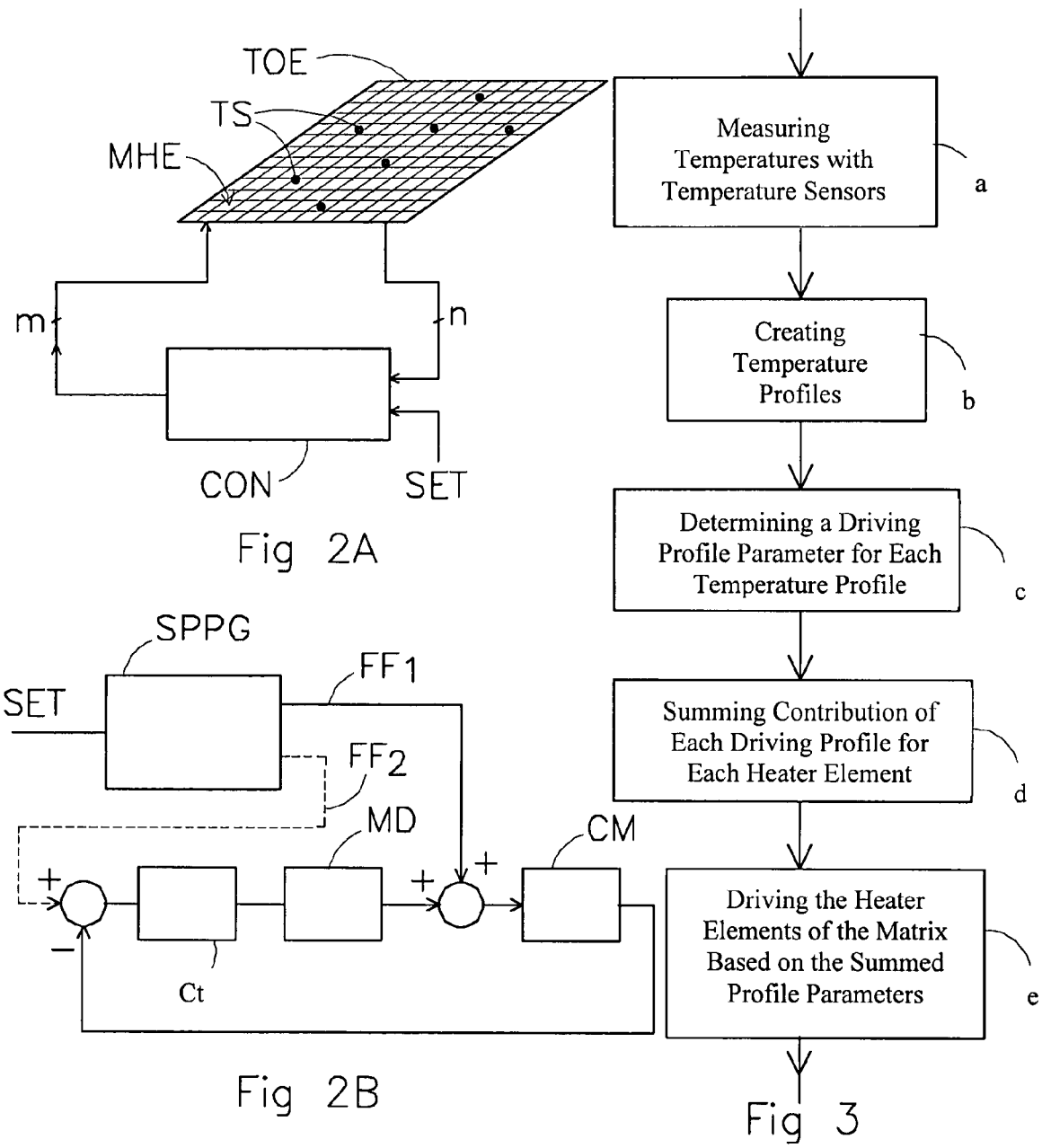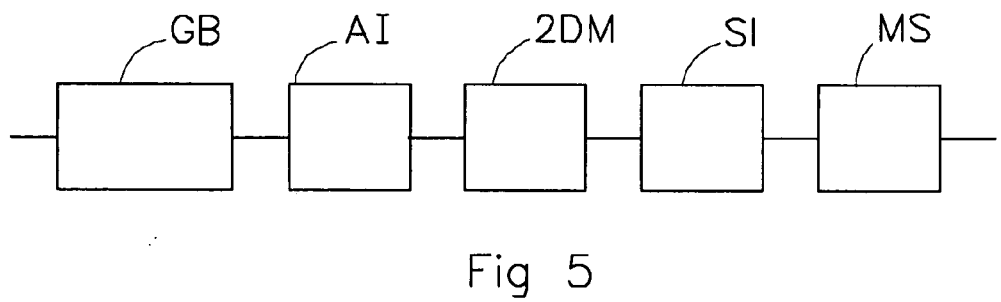

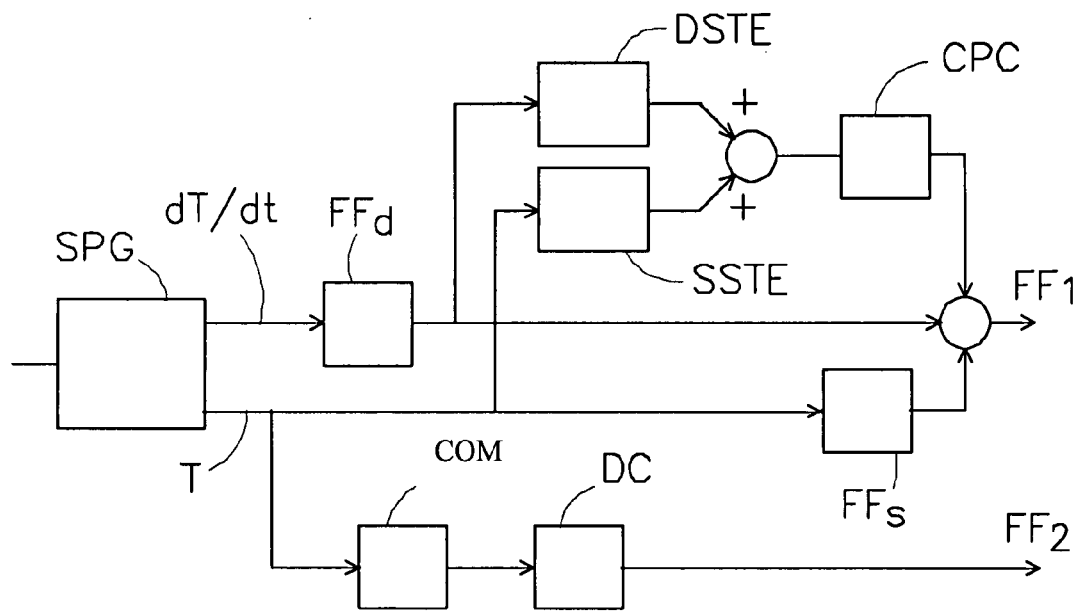
Fig 6
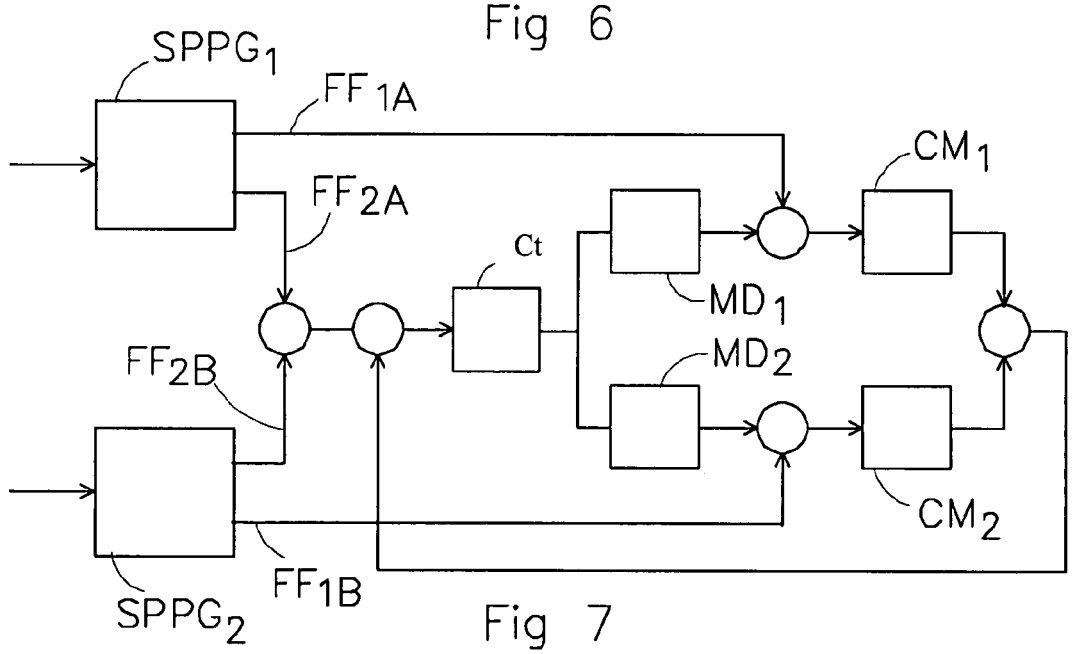
Fig 7
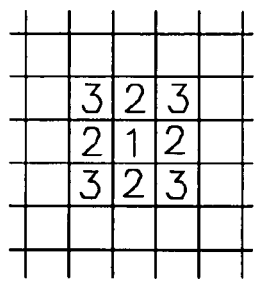 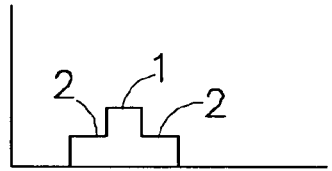
Fig 8

LITHOGRAPHIC APPARATUS AND THERMAL OPTICAL MANIPULATOR CONTROL METHOD

BACKGROUND

1. Field of the Invention

The present invention relates to a lithographic apparatus and a method for controlling a thermal optical manipulator.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the projection system of such lithographic apparatus, or in general in any optical system, aberrations may occur due to e.g. thermal effects in optical elements. As an example, a lens of the projection system may be subjected to a thermal profile, which may lead to differences in refractive index of a material of the lens, as the refractive index may show a temperature dependency. Thermal differences in optical elements may occur due to various causes: absorption of some of the radiation may cause an increase in temperature, gas flows may lead to a local increase or decrease of a surface temperature of an optical element, etc. To be able to at least partly compensate for such aberrations, a thermal optical element has been devised, as disclosed in co-pending U.S. patent application Ser. No. 11/593,648, which is incorporated herein in its entirety by reference.

Such thermal optical element is provided with a matrix of heater elements arranged on a surface thereof, each heater element e.g. consisting of a layer of conductive material and being able to be provided with electrical power to heat the heater element. The heater elements may thereby form a matrix, each of the heater elements may be provided with a suitable amount of electrical power to generate a suitable amount of heat thereby bringing the respective part of the thermal optical element to a suitable temperature.

Controlling a heating of each of the heater elements of the matrix may lead to a highly complex control structure. Furthermore, many parasitic effects would have to be taken into account. For example, conductors toward each of the heater elements of the matrix will provide for an amount of electrical dissipation in other parts of the thermal optical element.

SUMMARY

It is desirable to provide a simple yet effective control strategy for controlling the heating of the heater elements of the thermal optical element.

According to an embodiment of the invention, there is provided a control method for controlling a heating of a thermal optical element, the thermal optical element having a matrix of heater elements, the method including stabilizing a nominal temperature of the thermal optical element with a feedback loop to control the heating of heater elements; providing a desired temperature profile of the thermal optical element with a set point signal; determining a feed forward control of the heater elements from the set point signal; and forwardly feeding an output of the feed forward control into the feedback loop.

In another embodiment of the invention, there is provided a lithographic projection apparatus including a projection system configured to project a pattern from a patterning device onto a substrate, the projection system including a thermal optical element configured to correct lens aberrations of the projection system, the thermal optical element having a matrix of heater elements and a plurality of temperature sensors, and a controller configured to control a heating of the heater elements of the thermal optical element, the controller arranged to stabilize a nominal temperature of the thermal optical element with a feedback loop to control the heating of heater elements; provide a desired temperature profile of the thermal optical element by a set point signal; determine a feed forward control of the heater elements from the set point signal; and forwardly feed an output of the feed forward control into the feedback loop.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2A depicts a highly schematic block diagram of a thermal optical element and a controller according to an embodiment of the invention;

FIG. 2B depicts a highly schematic block diagram of the controller according to FIG. 2A;

FIG. 3 depicts an aspect of a control method for controlling a heating of such thermal optical element according to an embodiment of the invention;

FIG. 5 depicts a block diagram of a part of the controller according to FIG. 2B;

FIG. 6 depicts a block diagram of another part of the controller according to FIG. 2B;

FIG. 7 depicts a highly schematic block diagram of a controller according to a further embodiment of the invention; and FIG. 8 depicts graphical views of a set point profile according to an embodiment of the invention.

DETAILED DESCRIPTION

Figure 1:
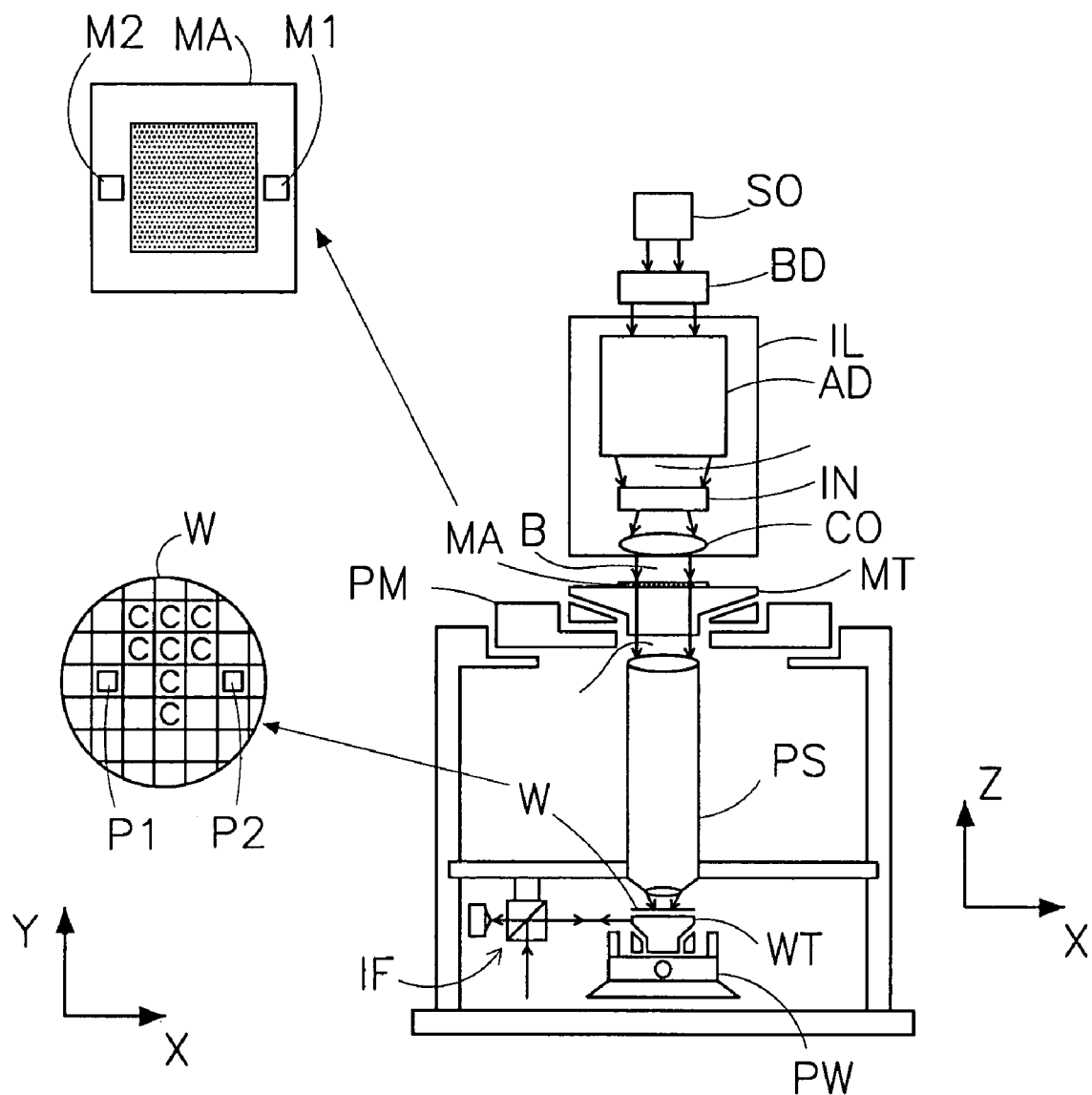
FIG. 1 depicts a lithographic apparatus in accordance with an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2.

Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the alignment marks may be located between the dies.

The depicted apparatus could be used in at least one of the following modes:

1. In step mode, the support structure (e.g. mask table) MT or "pattern support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "pattern support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "pattern support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "pattern support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2A highly schematically depicts a thermal optical element TOE provided with plurality of temperature sensors TS, in this example 8 temperature sensors TS distributed over a surface of the thermal optical element TOE. The thermal optical element is further provided with a plurality of heater elements arranged in a matrix, thereby providing a matrix of heater elements MHE. Each of the heater elements can be provided with electrical power to provide for a dissipation by the respective heater element, thereby heating a substrate (e.g. a glass or other optical transmissive element) of the thermal optical element. In general, the thermal optical element TOE will be incorporated in the projection system PS depicted in FIG. 1, the beam of radiation passing through the thermal optical element. In FIG. 2A, the thermal optical element TOE has been drawn in a highly schematic, perspective view, an optical axis of the projection system preferably being perpendicular to the surface of the thermal optical element TOE (thus in FIG. 2A in a vertical direction in the plane of drawing). To enable thermal stabilization, a gas flow or more generically a fluid flow (the fluid including a liquid and/or gas) along the surface of the thermal optical element may be provided, in a practical implementation it is for example possible that dual thermal optical elements are used in a stacked configuration, a gas flow being provided between them. The gas flow may e.g. include a cooled gas, i.e. a gas at a temperature which is lower than a nominal temperature of the thermal optical element TOE, to thereby enable a relatively fast reduction of a temperature of (a part of) the thermal optical element and to apply a cooling bias such that thermal energy can be applied by the heating or extracted by the cooling. The heater elements may include for example a conductive coating, and any suitable type of temperature sensor TS (such as a negative temperature coefficient resistor) may be applied.

As schematically depicted in FIG. 2A, a controller CON is provided to control a heating of the heater elements of the thermal optical element TOE. The controller may be implemented by a processing device, micro controller or other programmable element of the lithographic apparatus, provided with suitable program instructions to perform the actions as described below. In addition thereto, or instead thereto, the controller or parts thereof may be implemented by suitable hardware such as integrated electronic circuits, or other suitable electronic devices. The control device is provided as its input with a plurality of signals representing outputs of the temperature sensors TS of the thermal optical element TOE, an output of the controller being provided by a plurality of signals to drive the respective heater elements of the matrix of heater elements MHE. In this exemplary embodiment, in total 8 temperature sensors TS are provided, thereby 8 temperature signals being provided to the controller CON. In general, having a number of n temperature sensors TS, and n signals being provided to the controller CON, while, having m heater elements, m output signals being provided by the controller, n and m having been indicated in FIG. 2A. In an embodiment, n, respectively m parallel conductors may be applied, however it is also possible that any suitable kind of multiplexing, bus communication, data communication or other suitable serial or parallel communication is applied. Desired temperature profile of the thermal optical element may be provided by a set point signal SET.

FIG. 2B shows a block diagram to illustrate the control as provided by the controller according to FIG. 2A in accordance with an embodiment of the invention. The control diagram shows a feed forward path and a feedback control loop. The feedback control loop is provided by the controller Ct, the modal decoupling MD to convert heating power in "modal" control coordinates to heating grid, and a compensated mechanics CM in which the heater and temperature sensors are provided. A feed forward path is provided from the set point SET which provides a desired temperature profile of the thermal optical element via the set point profile generator SPPG to the feedback loop. Thereto, an output signal of the set point profile generator SPPG is forwardly fed as a feed forward signal into the feedback loop, in this embodiment added to the output of the modal decoupling MD, thereby providing an input to the compensated mechanics CM. The feedback loop in this example provides for a stabilizing of the thermal optical element to its nominal temperature, as will be explained in more detail below. The feed forward provides for an addition of a temperature profile, i.e. a desired temperature profile, on the stabilized i.e. nominal temperature of the thermal optical element. Thereby, a control of the heater elements may be split up in various aspects, including the stabilization to a nominal temperature, and the driving of the heater elements such that the desired temperature profile is provided. Further aspects include parasitic effects such as a smear of heat due to a gas flow flowing along a surface of the thermal optical element, etc., which will be described in more detail below. The present concept allows also such aspects to be dealt with in a separated away. In other words, the inventor has devised a control system and method which enables to handle many aspects of the control in an isolated manner, which enables to take care of the control of each of those aspects in the relatively easy to implement manner, whereby the processing power required to perform the control operations may be reduced. Further effects may include an increase in control speed, as well as a decrease in a number of temperature sensors required.

The set point profile generator SPPG may provide a further output signal to the control loop, indicated in FIG. 2 B by the dotted line. By this output signal, a compensation may be provided in case that the feed forward signal provided to the output of MD/input of CM of the feedback loop would influence the feed back operation, which may be the case in case that the feed forward would have effect on parts of the thermal optical element were the temperature sensors of the feedback loop are provided. The feed forward signal is indicated in FIG. 2B by FF1, while the further feed forward signal provided to the set point input of the feed back loop is indicated in FIG. 2B by FF2.

Figure 4:
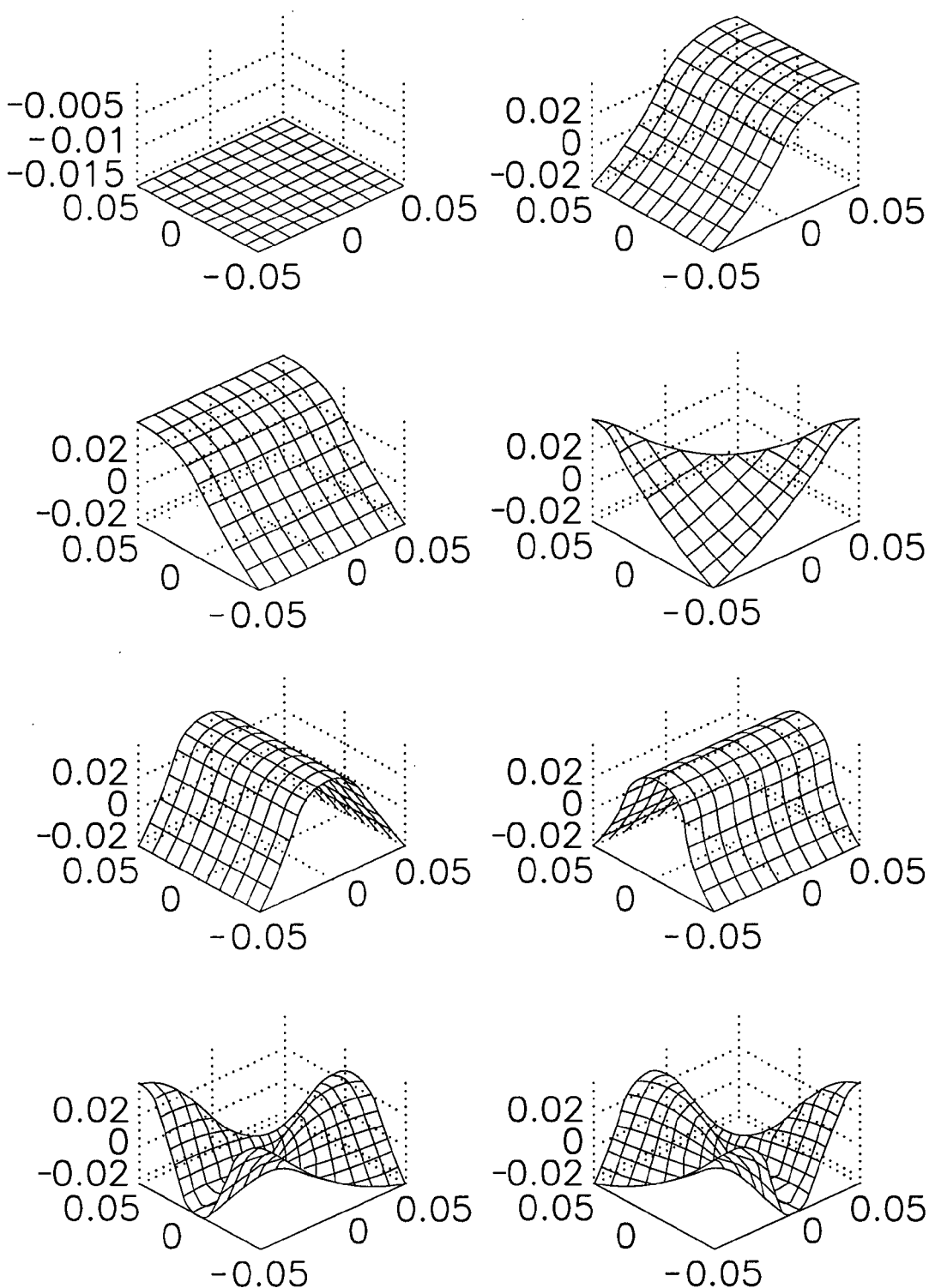
FIG. 4 depicts a plurality of thermal modes as may be applied in the control method.

An operation of the feedback loop of the controller CON will now be described with reference to FIG. 3. FIG. 3 shows a flow diagram of a method according to the invention, respectively the procedures to be performed by the control device CON as depicted in FIGS. 2A and B. In procedure a, a respective temperature is measured with the temperature sensors TS, the respective temperature being at a respective location of the thermal optical element where the temperature sensor in question is located. The control device thereby receives measurement signals, and measurement data or similar from one or more of the temperature sensors TS. In procedure b, the measured temperatures are parameterized into a plurality of geometrical temperature profiles of the thermal optical element. Examples of such temperature profiles are depicted in FIG. 4. The measured temperatures by the different temperature sensors are thus parameterized as a sum of contributions by individual geometrical temperature profiles from the plurality of geometrical temperature profiles. Possible benefits of such parameterization will be described below.

Then, in procedure c, for each of the geometrical temperature profiles a corresponding driving profile parameter is determined, the driving profile parameter to determine a driving of the heater elements of the matrix according to a corresponding geometrical driving profile corresponding to the geometrical temperature profile of the parameterization in procedure b. Then, in procedure d, for each heater element of the matrix the contribution of each driving profile is summed and in procedure e the heater elements of the matrix are driven based on the summed driving profile parameters.

Thus, for each of the geometrical temperature profiles, it is determined in how much the geometrical temperature profile in question contributes to the measured temperatures (procedure b), and to what extent the heater elements are to be driven in accordance with the temperature profile in question (procedure c). The driving of the heater elements now consists of an addition of the contribution of the driving by each of the temperature profiles. The term driving profile parameter is thus to be understood as a parameter for driving a respective geometrical temperature profile, in other words to express a heating by the heater elements in accordance with the temperature profile in question.

By the parameterization into the temperature profiles and controlling the heating according to the temperature profiles, a relatively easy to implement control strategy can be implemented. Instead of having a complex control system with a plurality of temperature inputs and a plurality of heater element outputs resulting in a complex control system, a relatively simple control architecture can now be implemented as the parameterization results in a plurality of single input single output control systems (an input of each control system being the parameterization into the respective geometrical temperature profile, the output being the driving profile parameter for that respective profile). Each of these profiles exhibits a predominantly first order behavior and can therefore be modeled in an accurate way by a first order time constant, providing for a plurality of first order, single input single output control systems for each of the temperature profiles.

As depicted in FIG. 4, many temperature profiles may be applied. Each of the temperature profiles may be assigned a time constant thus modelling the respective profile as a first order model. FIG. 4, at the top left, a zero order profile is depicted providing a flat temperature distribution. Next thereto 2 first order profiles are depicted. This is followed by increasingly complex profiles showing increasingly complex modes. In fact, to understand the profiles depicted here, an analogy may be provided with mechanical resonance modes. The temperature profiles may be considered (however is not limited to) an analogy of a mechanical resonance mode. The inventors have now devised that the more complex the profile, the shorter a time constant thereof is. As profiles having a short time constant, i.e. profiles which tend to diminish relatively fast by themselves by thermal conduction, will invoke less need to actively control or suppress, the inventors have devised that the parameterisation may take place into the less complex profiles, i.e. the profiles having an offset, a tilt, etc. which have a relatively long time constant, hence decay time. Given the fact that in this example, 8 temperature sensors are provided, a parameterization can be made into at maximum 8 profiles. Thus, the number of profiles according to the parameterization will at maximum be equal to 8, being the number of thermal sensors.

In a practical implementation, the thermal optical element may include a matrix of 14×14 heater elements, the number of heater elements thus largely exceeding the total of 8 temperature sensors provided on the thermal optical element. Thus, a control may be provided by the method and controller according to an embodiment of the invention, which provides for a controlling of an amount of heater elements which may largely exceed the amount of temperature sensors, by a relatively simple and thus relatively easy to implement controller.

While the flow diagram of FIG. 3 illustrates the feedback loop according to FIG. 2B, the block diagram depicted in FIG. 5 provides a further illustration of CM in FIG. 2B. In FIG. 5, the compensated mechanics thereby include a gain balancing matrix GB to provide electrical decoupling of the heating zones and correct for gain errors, an actuator interface AI, a two dimensional heater matrix indicated by 2DM, plurality of temperature sensors, symbolically indicated by sensor interface SI, and a temperature measurement system MS which may also take are of a transformation of sensor data to "modal" coordinates.

When driving a heater element, electrical current flowing through an electrical conductor towards that heater element may heat other heater elements. Therefore, a driving signal for a heater element may be compensated for a heater contribution to that heater element from an electrical current flowing through an electrical conductor towards another one of the heater elements. For such compensation, use may be made of a suitable matrix in which correlations between the driving of the heater elements are provided. This compensation is provided by the gain balancing GB in FIG. 5.

FIG. 6 depicts a more detailed blocks schematic view of the set point power profile generator SPPG according to FIG. 2B. FIG. 6 shows a set point generator SPG to convert a set point profile provided to it into a set point signal at the output indicated T and a time derivative of the set point signal at the output indicated by dT/dt. The non differentiated output of a set point generator is provided to a static feed forward matrix $FF_s$ to calculate the steady state power required for each heating zone to generate the set point temperature map. The differentiated set point signal is provided to the matrix $FF_d$ to calculate the power required for each heating zone, to follow the set point temperature changes. A dynamic surface temperature estimation matrix DSTE and a static surface temperature estimation matrix SSTE are provided to estimate a quasi static and dynamic surface temperature of the heater elements of the matrix. Each of the matrices is thereto provided with a corresponding dynamic (differentiated) or static (non differentiated) input. The outputs of the estimation matrixes are added and provided to a cooling power compensation matrix CPC to calculate the cooling power in each zone based on the actual surface temperature estimate. A gas flow is provided over the surface of the heater elements, which thus results in a cooling independency on the surface temperature of each heater element. Furthermore, when a particular heater element is cooled, this results in a change of temperature of the gas flowing along it, having effect on the cooling of downstream heater elements, i.e. heater elements along which the cooling gas passes after having past the heater element in question. Thus, the cooling power compensation matrix allows compensating for effect due to heating/cooling of the cooling gas by the temperature of the surface of the heater elements. The feed forward signal FF1 is now obtained by adding the static, dynamic and surface temperature effects, as illustrated in FIG. 6.

FIG. 6 further depicts a controller observance matrix COM to convert set point temperatures to control coordinates and a delay correction DC to provide a delay matching the feed forward signal FF1, the output of the cascade of the COM matrix and the delay compensation provide for the further feed forward signal FF1 provided to the set point input of the feed back loop as illustrated in FIG. 2B.

The set point is provided in terms of set point profiles, an embodiment thereof being depicted in FIG. 8. In a left view of FIG. 8, a profile is depicted which covers 3×3 heater elements, i.e. a total of 9 heater elements. Due to the discrete nature of the heater elements, the heating profiles show a stepped shape, thereby approximating a Gaussian like temperature distribution, i.e. a Gaussian like temperature profile in the thermal optical element. A centre indicated by 1 having a highest value, followed by heater elements neighbouring to it, being indicated by 2, and the cornering heater elements 3 again having a lower value. Neighbouring set point profiles overlap each other, and may be translated with respect to each other by at least one heater element in either direction in the plane of drawing of the left view of FIG. 8. A graphical presentation of the profile is shown in the right view of FIG. 8, where a relative value is set out along a vertical axis. By making use of such set point profiles each having effect on a limited area only, i.e. on a small subset of the total number of heater elements only, relatively easy to perform matrix operations may be provided in the diagrams shown in FIGS. 2B, 5, 6 and 7. A total set point profile may thereby be build up from a superposition of a plurality of the profiles thus shown, each of the profiles being displaced with respect to each other. Alternatively, a pyramidal shape may be provided. In an embodiment, a plurality of the set point profiles have a same outline but differ in that they are geometrically displaced with respect to one another.

FIG. 7 shows a schematically diagram of a control system where two thermal optical elements are both stabilized. The thermal optical elements can be provided in a sandwiched construction. Similarly to FIG. 2, feed forwards ($FF_{1A}$, $FF_{1B}$) are provided by SPPG1 and SPPG2 respectively for each of the thermal optic elements, while a feedback loop ($FF_{2A}$, $FF_{2B}$) is provided for each of the thermal optical elements also. It is noted that in the block diagrams, a line between a block and a following block may be understood as representing a signal having multiple variables. The control system also includes modal decoupling $MD_1$ and $MD_2$, and compensated mechanics $CM_1$ and $CM_2$. As an example, in case that 8 temperature sensors are provided per thermal optical element, the corresponding allowance in FIG. 5 are to represent 8 temperature sensing signals. In particular, in the examples described here, in a preferred embodiment 96 set point profiles are offered for a heater element matrix having 14×14 heater elements.

Embodiments of the invention may thus provide for an effective use of processing power, e.g. by the described selection of the set point profiles and the parameterization in the diametrical temperature profiles, while an adequate modelling of a thermal and dynamic as well as parasitic behaviour of the thermal optical element may be provided by splitting the control in to a stabilisation, a static and dynamic set point application and a handling of parasitic effects, such as surface temperature effects and associated cooling, heating due to conductors running along other heater elements etc.

Further, compensation may be provided for a thermal contribution to a heater element from a gas stream flowing along a surface of the thermal optical element, a driving signal for the heater elements may be compensated accordingly by a suitable matrix calculation operation. In such matrix, an effect of a heating of a heater element on a temperature of a downstream heater element, may be expressed. In the compensation, the thermal contribution may be determined from an initial temperature of the gas stream and a contribution by upstream heater elements onto the temperature of the gas stream.

A temperature gradient in a temperature perpendicular to the surface of the thermal optical element may be modelled by a first order model, a driving signal for each heater element may be adapted via the modelling to take account of temperature differences along the direction perpendicular to the surface of the thermal optical element by the temperature gradient. Thereby, a temperature in the direction perpendicular to the surface of the thermal optical element is modelled in a relatively simple manner resulting in a simple, first order control system as the driving signal (which drives the heater element on a surface of the thermal optical element) is then easily adapted to take account of thermal delays in the direction perpendicular to the surface of the thermal optical element.

It is remarked that in a normal application, the thermal optical element is irradiated in a direction substantially perpendicular to the surface thereof, i.e. in FIG. 2A in a direction from above to below or visa versa.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method, comprising:
   stabilizing a nominal temperature of a thermal optical element with a feedback loop to control heating of a plurality of heater elements;
   providing a desired temperature profile of the thermal optical element with a set point signal;
   determining a feed forward control of the heater elements from the set point signal;
   forwardly feeding an output of the feed forward control into the feedback loop;
   measuring, with a plurality of temperature sensors, a respective temperature at respective locations of the thermal optical element to determine a resulting measured temperature profile;
   computationally carrying out a modal decoupling of the measured temperature distribution to express said temperature distribution as a weighted sum over fundamental modes of the thermal optical element, said modes being called geometrical temperature profiles;
   determining, for each of the geometrical temperature profiles in the weighted sum, a corresponding driving profile parameter, which is a predicted distribution of power to be sent to the heating elements to maintain a given steady state geometric temperature profile;
   determining a feedback signal by forming a weighted sum of the individual driving profile parameters corresponding to each of the geometric temperature profiles, with each term in the sum being multiplied by the corresponding coefficient in the modal decoupling of the measured temperature distribution; and
   adjusting the feed-forward signal to reduce any difference between the feed-forward and feedback signals, such that the resulting measured temperature distribution is substantially equal to the desired temperature distribution.

2. The method according to claim 1, wherein the geometrical temperature profiles are dynamically modeled with a respective first order model.

3. The method according to claim 1, wherein the geometrical temperature profiles comprise at least one of an offset profile, a tilt profile, and a parabolic profile.

4. The method according to claim 1, wherein a number of the geometrical temperature profiles is smaller than or equal to a number of the temperature sensors.

5. The method according to claim 1, wherein a number of heater elements is greater than a number of the plurality of temperature sensors.

6. The control method according to claim 1, wherein the set point signal is provided in the form of a modal decoupling as a weighted sum over a collection of set point profile parameters, each set point profile parameter being related to a corresponding set point profile, each set point profile providing for a temperature setting of a subset of the heater elements of the matrix.

7. The method according to claim 6, wherein a plurality of the set point profiles have a same outline.

8. The method according to claim 7, wherein the plurality of the set point profiles are geometrically displaced with respect to one another.

9. The method according to claim 8, wherein neighboring set point profiles of the plurality of set point profiles are displaced with respect to each other by at least one heater element in a first direction along the matrix of heater elements or at least one heater element in a second direction along the matrix of heater elements to form a two dimensional arrangement of set point profiles.

10. The method according to claim 9, wherein each of the plurality of set point profiles has a pyramidal or Gaussian shape.

11. The method according to claim 9, wherein each of the plurality of set point profiles is configured to set a temperature of a group of nine heater elements, consisting of three heater elements along a first direction times three heater elements along a second direction, the second direction being substantially perpendicular to the first direction.

12. The method according to claim 6, wherein a set point heating power contribution for the heater elements is determined from the set point profile parameters for the corresponding set point profiles.

13. The method according to claim 6, wherein a time derivative of the set point profiles is determined, a steady state heating power desired for each heater element being calculated from the set point by a first heating matrix, and a dynamic heating power desired for each heater element being calculated from the time derivative by a second heating matrix.

14. The method according to claim 13, wherein a dynamic surface temperature estimation matrix is provided to estimate a dynamic surface temperature contribution of the heater elements from the time derivative.

15. The method according to claim 14, wherein a static surface temperature estimation matrix is provided to estimate a quasi static surface temperature contribution of the heater elements from the set point signal.

16. The method according to claim 15, wherein the static and dynamic surface temperature contributions are added and wherein a cooling power compensation by a cooling gas flow is determined from the added contributions by a cooling power compensation matrix, the cooling power compensation to compensate a heating of the heater elements for cooling of a surface thereof by a cooling gas flow.

17. The method according to claim 14, wherein a temperature gradient in a direction perpendicular to the surface of the thermal optical element is modeled by a first order model, and wherein a driving signal for each heater element is adapted via the modeling to take into account temperature differences along the direction perpendicular to the surface of the thermal optical element by the temperature gradient.

18. The method according to claim 1, wherein a gain balancing matrix is provided to compensate a driving signal of one of the heater elements for a contribution to that heater element from an electrical current flowing through an electrical conductor towards another one of the heater elements.

* * * * *